(12) United States Patent
Yang

(10) Patent No.: US 6,627,495 B2
(45) Date of Patent: Sep. 30, 2003

(54) METHOD FOR FORMING A CAPACITOR IN A SEMICONDUCTOR DEVICE

(75) Inventor: Woo-Seok Yang, Ichon-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/034,828

(22) Filed: Dec. 28, 2001

(65) Prior Publication Data

US 2002/0094657 A1 Jul. 18, 2002

(30) Foreign Application Priority Data

Dec. 28, 2000 (KR) ........................................ 2000-84533

(51) Int. Cl.$^7$ .......................................... H01L 21/8242
(52) U.S. Cl. ........................ 438/240; 438/253; 438/396
(58) Field of Search ........................... 438/200, 3, 240, 438/250, 253, 255, 396, 397, 398, 156, 216

(56) References Cited

U.S. PATENT DOCUMENTS 6,380,574 B1 * 4/2002 Torii et al. .................. 257/295

* cited by examiner

Primary Examiner—Phat X. Cao
Assistant Examiner—Theresa T. Doan
(74) Attorney, Agent, or Firm—Marshall, Gerstein & Borun

(57) ABSTRACT

A method for forming a capacitor in a semiconductor device is disclosed, in which the dielectric medium of the capacitor is a ferroelectric film or a high dielectric constant film. In the method for forming a capacitor in a semiconductor device, peeling of the lower electrode is prevented, and the etch residues (organic polymer) which have been formed when carrying out a dry etching can be effectively removed.

6 Claims, 8 Drawing Sheets

METHOD FOR FORMING A CAPACITOR IN A SEMICONDUCTOR DEVICE

FIELD OF THE INVENTION

The invention relates generally to a method for forming a capacitor in a semiconductor device, wherein the dielectric medium of the capacitor is a ferroelectric film or a high dielectric constant film.

DESCRIPTION OF RELATED ART

Ferroelectric material has come to be applied in semiconductor devices owing to its high dielectric constant and to its non-volatility and, thus, its ability to increase the density of DRAM (dynamic random access memory) and to form a new nonvolatile memory (FeRAM).

Typical ferroelectric materials include: $Pb(Zr_xTi_{x-1})O_3$ ("PZT"); $(Sr,Bi)Ta_2O_9$("SBT"); $SrBi_2(Ta,Nb)_2O_9$ ("SBTN"); and $(Bi_xLa_y)Ti_3O_{12}$("BLT"). For the upper and lower electrodes of the capacitor, metals such as platinum (Pt), iridium (Ir), ruthenium (Ru), and their alloys are used. In a ferroelectric capacitor, if a superior dielectric constant is to be obtained in the ferroelectric film, proper selection of the material for the upper and lower electrodes and proper control of the formation process are required.

Meanwhile, ferroelectric capacitors can be classified as an NPP structure and a plug poly (PP) structure. In the ferroelectric capacitor of the NPP structure, the upper electrode is connected through a metal wiring to the junction of a MOS transistor, so that the upper electrode can serve as a storage node, and the lower electrode can serve as a cell plate node.

On the other hand, in a ferroelectric capacitor of the PP structure, the lower electrode is connected through a polysilicon plug to the junction of a MOS transistor, so that the lower electrode can serve as a storage node, and the upper electrode can serve as a cell plate node.

In view of the density of the device, the ferroelectric capacitor of the PP structure preferably should be adopted rather than the ferroelectric capacitor of the NPP structure. However, if the PP structure is to be adopted, then a process difficulty is encountered.

That is, when forming the dielectric medium and the upper and lower electrodes, and when going through a high temperature thermal process such as the post-heat treatment, oxygen is diffused and, thus, a low dielectric constant silicon oxide film is formed upon the silicon oxide film ($SiO_2$). In this case, externally supplied voltage is mostly imposed on the low dielectric constant silicon oxide film, with the result that a fatal defect is generated to hinder the operation of the device.

Meanwhile, the ferroelectric capacitor of the NPP structure is formed upon a silicon oxide film which is an interlayer insulating film. However, the metals or the alloys that are used for forming the lower electrode are very weak in the property of adhering to the silicon oxide film. Therefore, after going through the post thermal process, the lower electrode is peeled off, with the result that the yield of the device is greatly reduced.

In order to prevent this peeling phenomenon, usually there is inserted a $TiO_x$ film or a Ti film between the interlayer insulating film and the lower electrode.

In fabricating the above described ferroelectric capacitor of the NPP structure or the PP structure, the most fastidious process steps are the etching of the ferroelectric medium and the upper and lower electrodes.

That is, the ferroelectric film and the upper and lower electrodes cannot be etched chemically so that a physical etching process should be used to etch the ferroelectric film and the upper and lower electrodes.

In order to remove such a polymer, usually the photoresist is removed, and then a cleaning is carried out with a pure (de-ionized) water.

FIG. 1A illustrates the particle distribution which is measured with a KLA apparatus after a cleaning with pure water. FIG. 1B graphically illustrates the number of the particles for different size classes as measured in FIG. 1A.

In the case where cleaning is carried out with pure water, peeling of the capacitor pattern does not occur. However, the number of the detected particles is very high as shown in FIGS. 1A and 1B and, therefore, it is judged that cleaning with pure water is not effective at all in removing the organic polymer.

In order to solve the problems occurring when using the pure water in cleaning, it is proposed that EKC830 solution or ACT935 solution (amine-based organic solvents) be used.

FIG. 2A illustrates the particle distribution measured with a KLA apparatus after carrying out cleaning with an organic solvent. FIG. 2B graphically illustrates the number of the particles for different size classes as measured in FIG. 2A.

Referring to FIGS. 2A and 2B, in view of the fact that the number of the particles have been markedly decreased, it can be seen that most of the polymer has been removed. However, it is also seen that peeling of the capacitor pattern has occurred.

This peeling phenomenon is caused by the fact that the adhesive force between the lower electrode and the adhesive layer has been drastically weakened. Meanwhile, this adhesive layer is employed also in the PP structure, and therefore, the peeling phenomenon can occur even in the fabrication process for the PP structure capacitor. This problem can occur in the fabrication process for all the ferroelectric capacitors.

SUMMARY OF THE INVENTION

The invention is intended to overcome one or more of the above-described disadvantages of conventional techniques.

Therefore, it is an objective of the invention to provide a method for forming a capacitor in a semiconductor device, in which any peeling of the lower electrode is prevented, and the etch residues (organic polymer) formed during dry etching can be effectively removed.

In achieving this objective, a method for forming a capacitor in a semiconductor device according to the invention, with metal-based materials being used for upper and lower electrodes of the capacitor, includes the steps of: (a) carrying out a dry etch by using a photoresist pattern to expose a metal-based material on a substrate; (b) spreading an organic film upon the entire substrate after finishing the first step; and (c) carrying out a cleaning step to remove the organic film.

Preferably, after step (a), a step is carried out in which the photoresist pattern is removed.

Preferably, after step (b), a step is carried out in which a drying is carried out on the organic film.

Preferably, the organic film is polyhydroxystyrene, and in this case, at the third step, the polyhydroxystyrene and the photoresist pattern may be simultaneously removed.

Preferably, the drying is carried out at a temperature of 50° C. to 100° C. for 5 minutes to 20 minutes.

Preferably, in the case where the organic film is polyhydroxystyrene, the cleaning may be carried out with an MMP (methylmethoxypropionate) solution.

Preferably, the organic film is formed to a thickness of 1 $\mu$m to 10 $\mu$m.

BRIEF DESCRIPTION OF THE DRAWINGS

The above objective and other advantages of the invention will become more apparent by describing in detail the preferred embodiment of the invention with reference to the attached drawings in which.

DETAILED DESCRIPTION OF THE INVENTION

The invention is based on the following principles. When carrying out a dry etch process to form the high dielectric constant capacitor structure, etch residues are generated, most of which are organic materials. Therefore, the organic film is made to capture the etch residues, and then the organic film with the etch residues captured therein is removed by cleaning. Consequently, not only the etch residue-removing effect is superior, but also any peeling of the lower electrode can be prevented during the cleaning.

A preferred embodiment of the invention is described below in such a manner that those of ordinary skill in the art can carry out the invention.

FIGS. 3A to 3D illustrate the fabrication process for a ferroelectric capacitor according to an embodiment of the invention. This process will be described referring to the attached drawings.

Figure 3A:
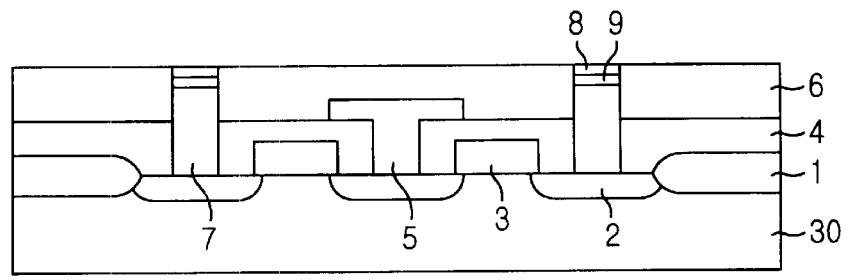
FIGS. 3A to 3D illustrate the process for forming the ferroelectric capacitor in one embodiment of the invention.

In a preferred embodiment of the invention, as shown in FIG. 3A, there are formed a device isolation film 1, a word line 3, a junction 2 and a bit line 5 upon a silicon substrate 30. Then the resultantly formed interlayer insulating films 4 and 6 are selectively etched, thereby forming a lower electrode contact hole. Then, a polysilicon plug 7, a silicide film 8 and a barrier metal layer 9 are filled into the contact hole.

Under this condition, the silicide film 8 is for forming an ohmic contact, and therefore, it is formed with Ti silicide or Co silicide. The barrier metal layer 9 is formed with TiN, TiAlN, or TiSiN.

Figure 3B:
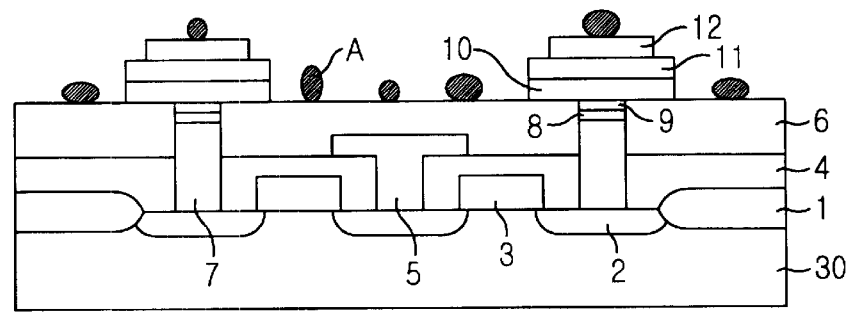

Then as shown in FIG. 3B, a conductive film (for a lower electrode), a ferroelectric thin film, and a conductive film for an upper electrode are sequentially formed upon the entire structure. Then thereupon, a photoresist pattern (not illustrated) is formed with a photo process using an upper electrode mask. Then, by using the photoresist pattern, the conductive film for the upper electrode is dry-etched to define an upper electrode 12, and the photoresist pattern is then removed.

Then upon the above-described structure, another photoresist pattern (not illustrated) is formed with a photo process using a lower electrode mask. Then by using the photoresist pattern, both the ferroelectric thin film 11 and the conductive film for the lower electrode are dry-etched, thereby defining a lower electrode 10. The photoresist pattern is then removed.

Under this condition, prior to depositing the conductive film for the lower electrode, there can be formed an adhesive layer (TiO$_x$, Ti) so that the adhesive force between the interlayer insulating film 6 and the conductive film for the lower electrode can be improved.

The lower electrode 10 is formed with IrO$_x$/Ir, or Pt/IrO$_x$/Ir, while the ferroelectric thin film 11 is formed with PZT, SBTN, or BLT. Meanwhile, the upper electrode 12 is formed with Pt, or IrO$_x$. Under this condition, after removing the photoresist pattern, a large amount of etch residues A remain on the substrate.

Figure 3C:
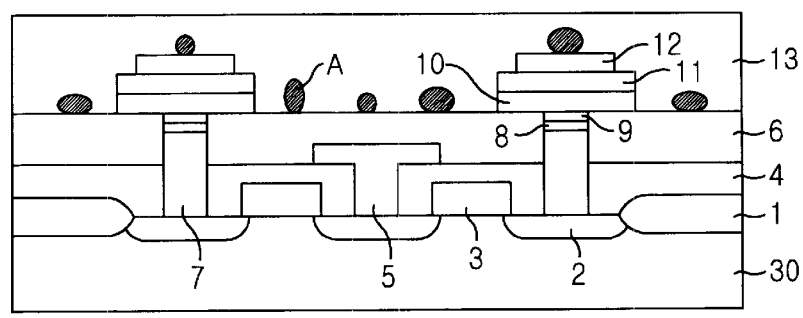

Then as shown in FIG. 3C, an organic film 13 is spread to a thickness of 1 Angstrom to 10 Angstroms upon the entire substrate. Under this condition, the etch residues A, which compare an organic polymer, are captured onto the organic film, and for the sake of an efficient capture of them, there is carried out a drying at a temperature of 50° C. to 100° C. for 5 minutes to 20 minutes after spreading the organic film 13. Under this condition, the organic film 13 comprises polyhydroxystyrene.

Figure 3D:
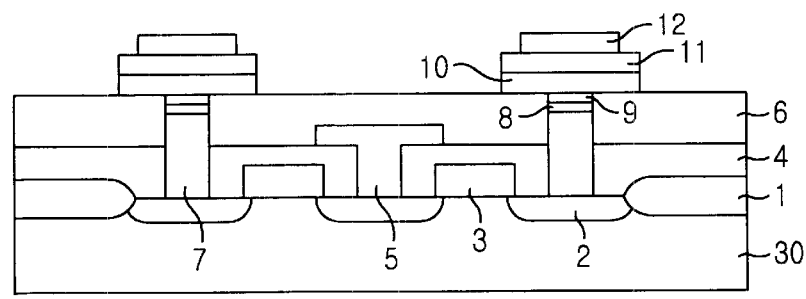

Then as shown in FIG. 3D, the organic film 13 together with the etch residues is removed by carrying out a cleaning step. Under this condition, if the organic film is a photoresist, then MMP(methylmethoxypropionate) is used as the cleaning fluid.

Thereafter, a recovery heat treatment is carried out to recover the ferroelectric properties of the dielectric film, which had been degraded during the dry etch.

Figure 4A:
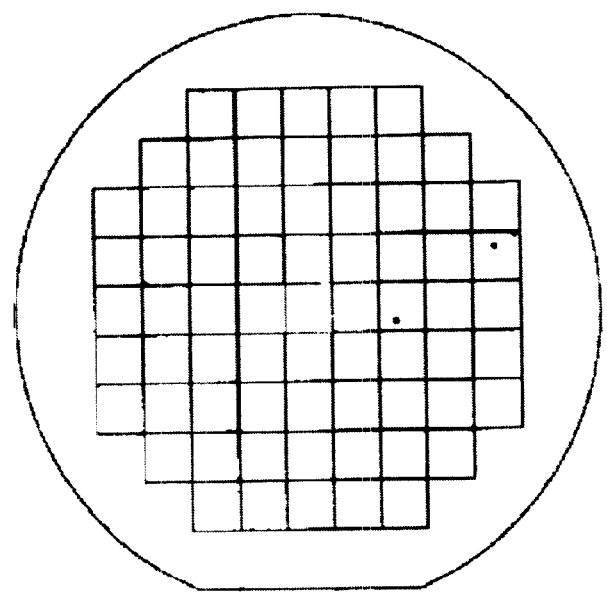
FIG. 4A illustrates the particle distribution which is measured with a KLA apparatus after carrying out a wet cleaning with an organic film.
Figure 4B:
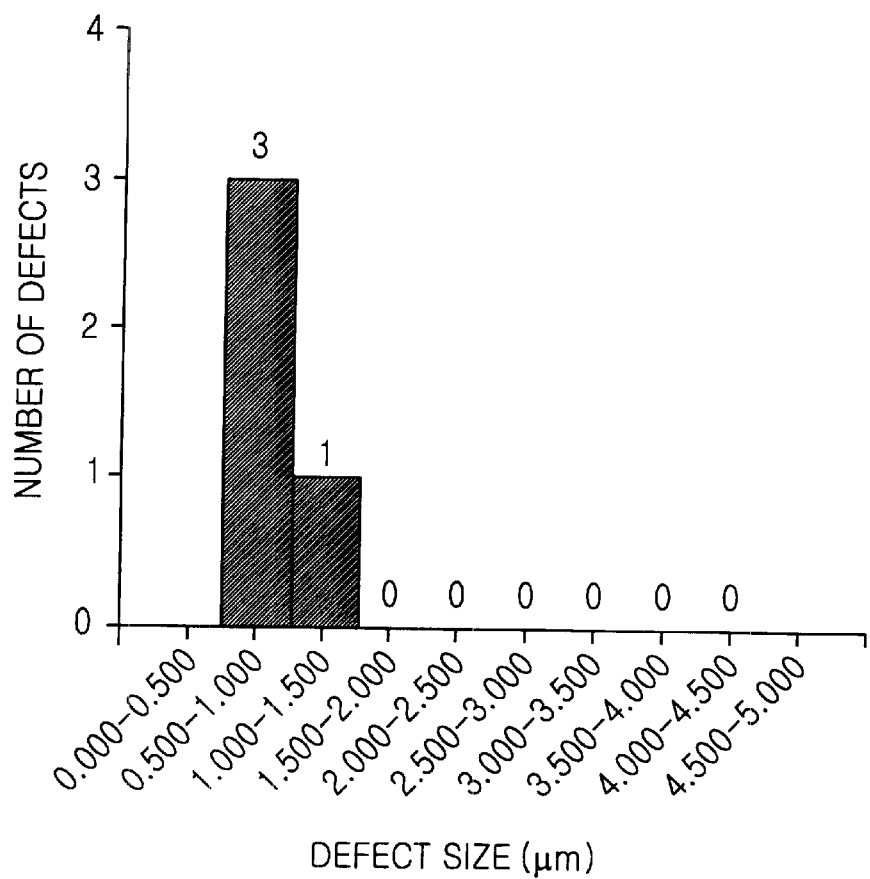
FIG. 4B graphically illustrates the number of the particles for different size classes as measured in FIG. 4A.

FIG. 4A illustrates the particle distribution, which was measured with a KLA apparatus after carrying out a cleaning with an organic film. FIG. 4B graphically illustrates the number of the particles for different size classes as measured in FIG. 4A.

Figure 1A:
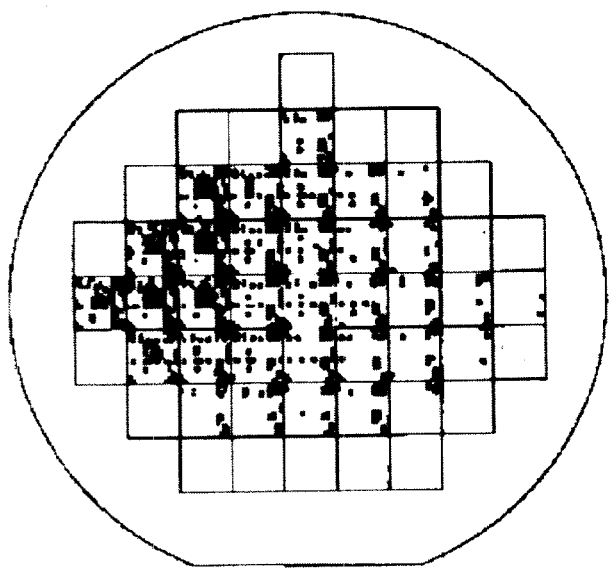
FIG. 1A illustrates the particle distribution which is measured with a KLA apparatus after carrying out cleaning with pure water.
Figure 1B:
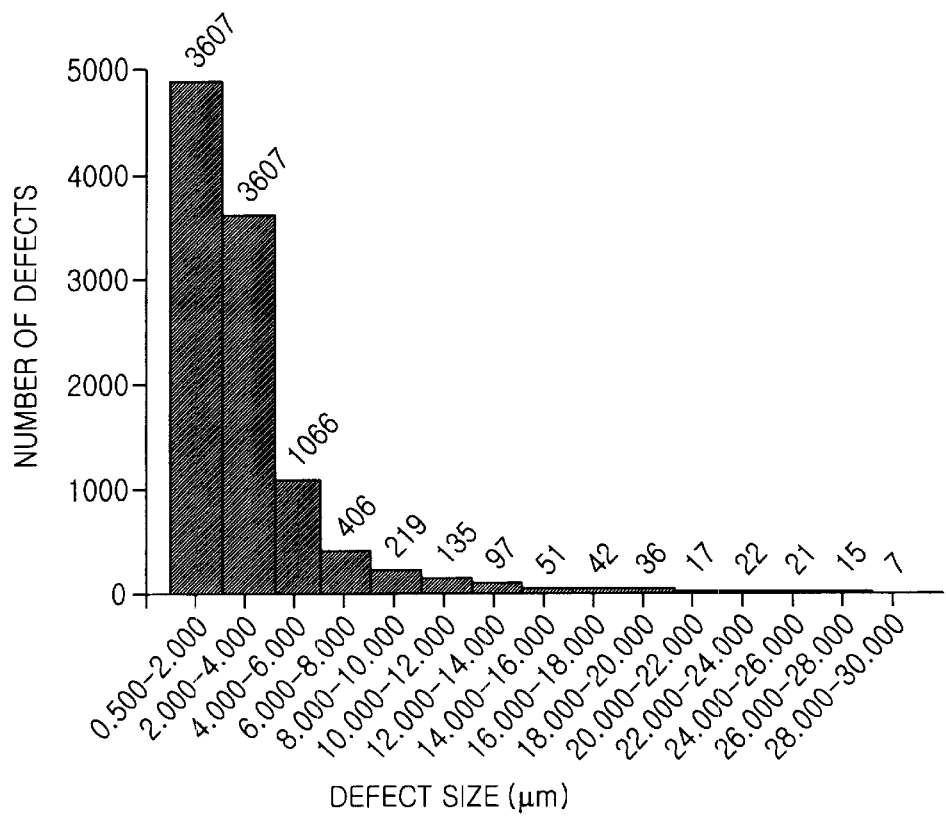
FIG. 1B graphically illustrates the number of the particles for different size classes as measured in FIG. 1A.
Figure 2A:
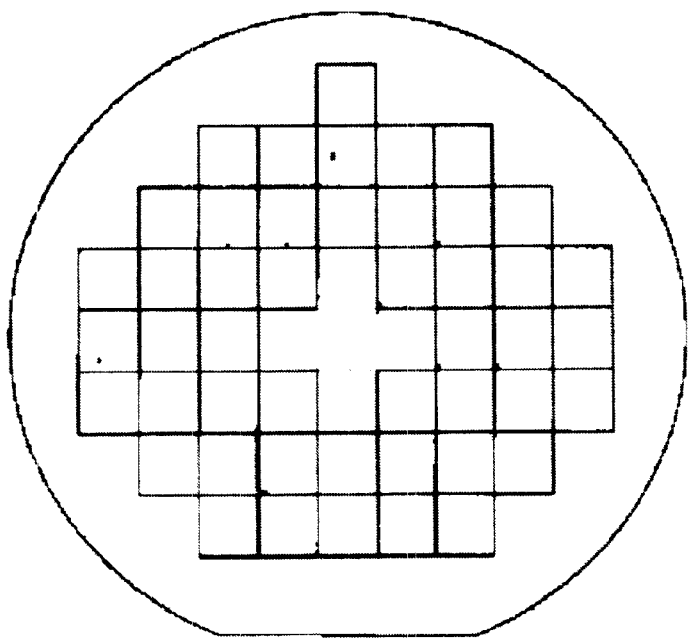
FIG. 2A illustrates the particle distribution which is measured with a KLA apparatus after carrying out cleaning with an organic solvent.
Figure 2B:
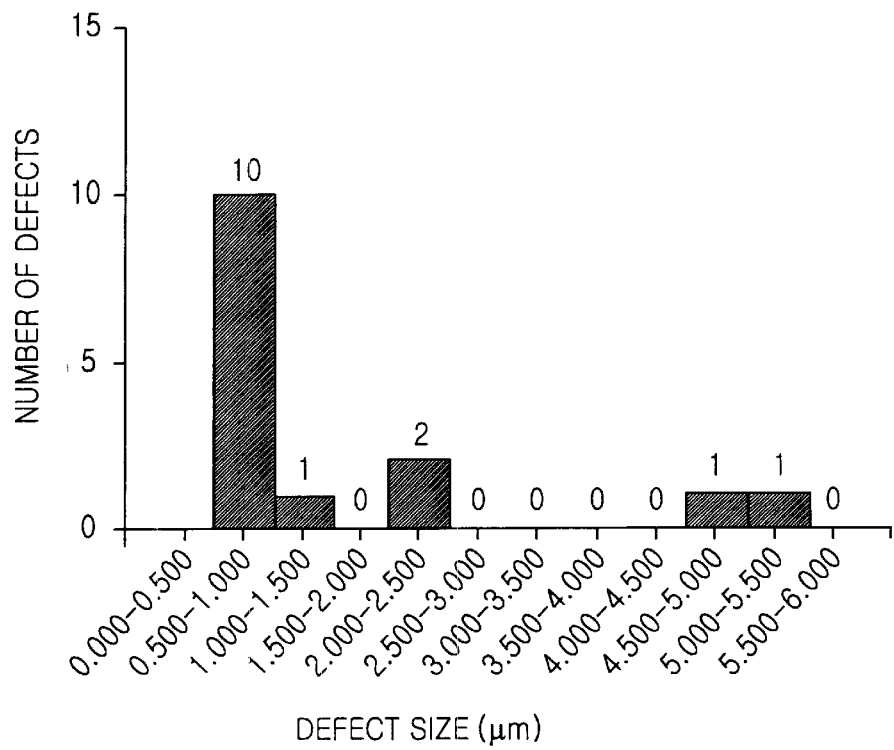
FIG. 2B graphically illustrates the number of the particles for different size classes as measured in FIG. 2A.

First referring to FIGS. 4B and 4D, in the case where a cleaning is carried out by utilizing the organic film according to the invention, the number of the detected particles was smaller than that of the case where the cleaning was carried out using an organic solvent according to the method of FIGS. 2A and 2B. This proves the fact that the etch residues are captured into the organic film, and are removed together with the organic film when carrying out the cleaning to remove the organic film.

Further, even when this cleaning was carried out using the organic film, any peeling of the capacitor pattern did not occur.

According to the invention as described above, the etch residues (organic polymer) which have been formed during the dry etch can be effectively removed, and any peeling of the lower electrode is prevented during the cleaning.

In the above, the invention was described based on the specific preferred embodiments and the attached drawings, but it should be apparent to those of ordinary skill in the art that various changes and modifications can be added without departing from the spirit and scope of the invention, which will be defined in the appended claims. That is, the above specific descriptions are presented for only describing purpose, and various other embodiments will be possible.

That is, in the above, the capacitor of the invention was described based on the PP structure, but the invention can be applied also to the NPP structure.

Further, in the above, the fabrication method for the ferroelectric capacitor was described, but the invention can be applied also to the fabrication methods for other high dielectric constant capacitors in which a high dielectric constant material such as $Ta_2O_5$ or $(Ba, Sr)TiO_3$ (BST) is used.

While the invention has been described with respect to the particular embodiments, it will be apparent to those skilled in the art that various changes and modifications may be made without departing from the spirit and scope of the invention as defined in the following claims.

What is claimed is:

1. A method for forming a capacitor in a semiconductor device, said capacitor comprising upper and lower electrodes, each comprising a ferroelectric thin film and a conductive film, said method comprising the steps of:

(a) dry etching a substrate comprising the ferroelectric thin film and the conductive film by using a photoresist pattern to expose the ferroelectric thin film and the conductive film;

(b) spreading an organic film comprising polyhydroxystyrene upon the entire substrate after finishing step (a); and (c) cleaning to remove the organic film.

2. The method of claim 1, further comprising the step of removing the photoresist pattern after step (a).

3. The method of claim 1, further comprising the step of drying the organic film after step (b).

4. The method of claim 1, wherein a drying is carried out at a temperature of 50° C. to 100° C. for 5 minutes to 20 minutes after finishing step (b).

5. The method of claim 1, wherein the cleaning is carried out with a MMP methylmethoxypropionate solution.

6. The method of claim 1, wherein the organic film is spread to a thickness of 1 μm to 10 μm.

* * * * *